United States Patent [19]

Murakoshi et al.

[11] Patent Number: 5,656,859

[45] Date of Patent: Aug. 12, 1997

[54] SEMICONDUCTOR DEVICE

[75] Inventors: Atsushi Murakoshi, Kawasaski; Masao Iwase; Kyoichi Suguro, both of Yokohama; Mitsuo Koike, Kamakura; Tadayuki Asaishi, Kawasaki, all of Japan

[73] Assignee: Kabushiki Kaisha Toshiba, Kawasaki, Japan

[21] Appl. No.: 622,589

[22] Filed: Mar. 26, 1996

[30] Foreign Application Priority Data

Mar. 27, 1995 [JP] Japan .................. 7-068131
Sep. 14, 1995 [JP] Japan .................. 7-237467
Mar. 13, 1996 [JP] Japan .................. 8-056281

[51] Int. Cl.$^6$ .................. H01L 23/48; H01L 23/52; H01L 29/40
[52] U.S. Cl. .................. 257/750; 257/63
[58] Field of Search .................. 257/65, 249, 344, 257/370

[56] References Cited

U.S. PATENT DOCUMENTS

| 4,928,156 | 5/1990 | Alvis .................. 357/23.4 |
| 4,939,561 | 7/1990 | Yamaka .................. 357/15 |
| 5,216,271 | 6/1993 | Takagi et al. .................. 257/370 |
| 5,241,197 | 8/1993 | Murakami et al. .................. 257/192 |
| 5,336,903 | 8/1994 | Oztork et al. .................. 257/65 |

FOREIGN PATENT DOCUMENTS

| 62-76550 | 4/1987 | Japan . |
| 4-96325 | 3/1992 | Japan . |
| 4-225568 | 8/1992 | Japan . |
| 5-90208 | 4/1993 | Japan . |

*Primary Examiner*—Sara W. Crane
*Assistant Examiner*—Douglas Wille
*Attorney, Agent, or Firm*—Oblon, Spivak, McClelland, Maier & Neustadt, P.C.

[57] ABSTRACT

An impurity diffusion surface layer is formed in a surface of a silicon substrate, and an aluminum electrode is arranged in direct contact with the impurity diffusion layer. The surface layer contains Ge as an impurity serving to change the lattice constant in a concentration of at least $1 \times 10^{21}$ cm$^{-1}$ under a thermal non-equilibrium state. The lattice constant of the surface layer is set higher than that of silicon containing the same concentration of germanium under a thermal equilibrium state. As a result, it is possible to decrease the Schittky barrier height at the contact between the surface layer and the electrode. The surface layer also contains an electrically active boron as an impurity serving to impart carriers in a concentration higher than the critical concentration of solid solution in silicon under a thermal equilibrium state. The presence of Ge permits the carrier mobility within the surface layer higher than that within silicon.

13 Claims, 9 Drawing Sheets

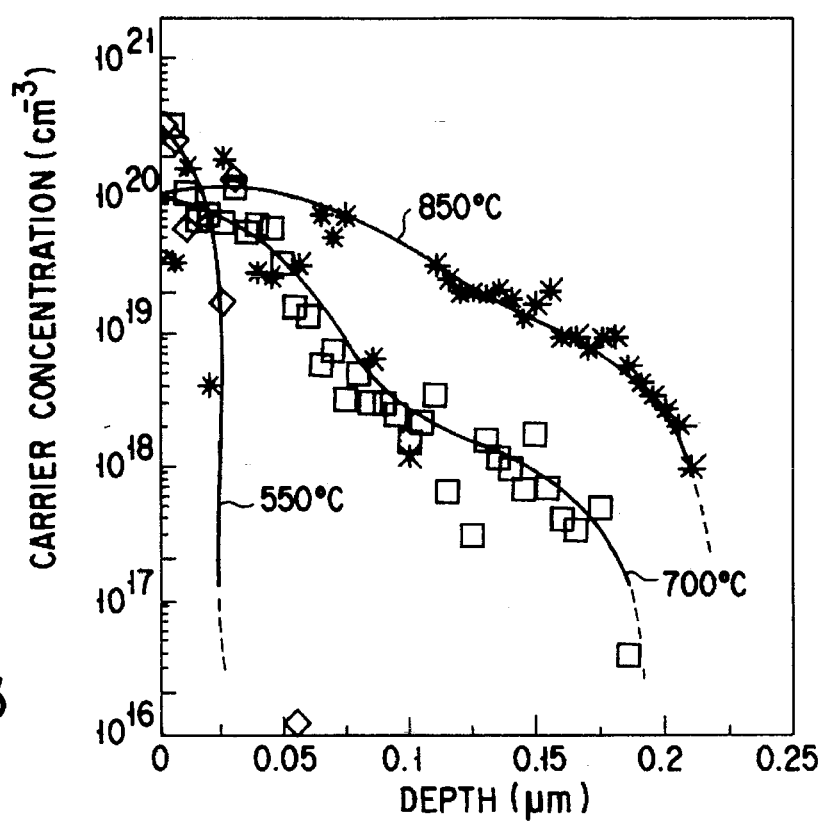
F I G. 3
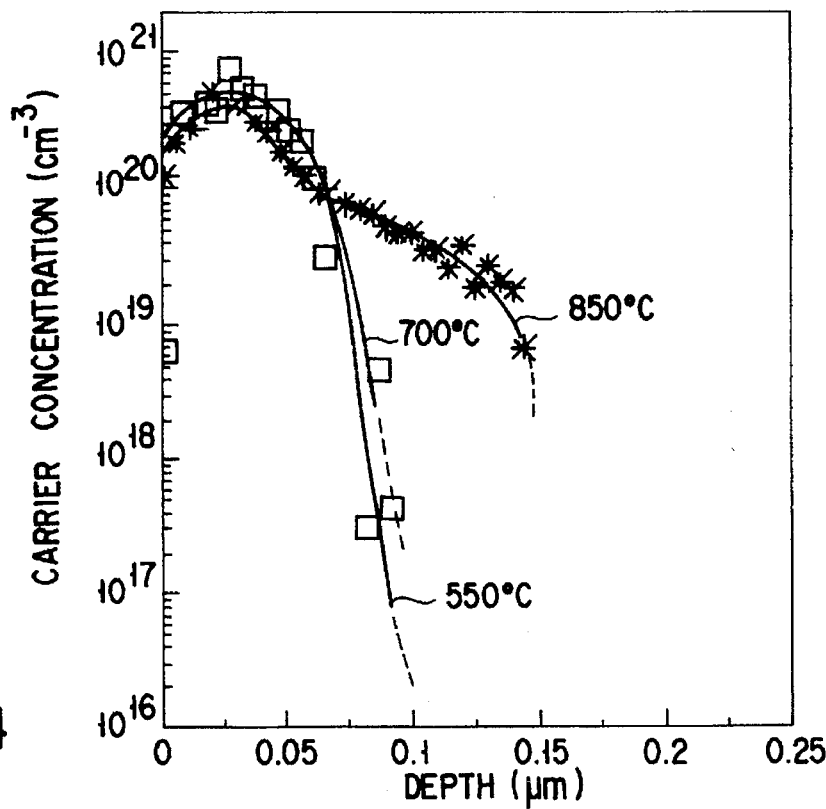
F I G. 4

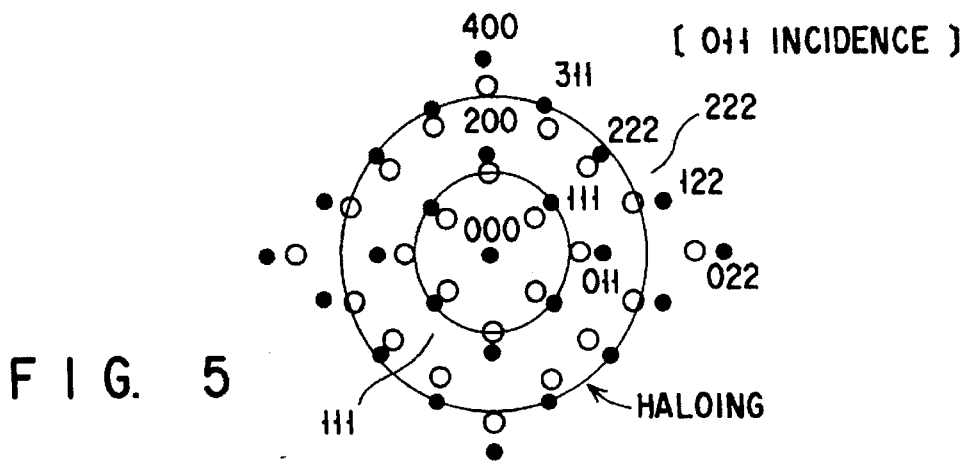
F I G. 5
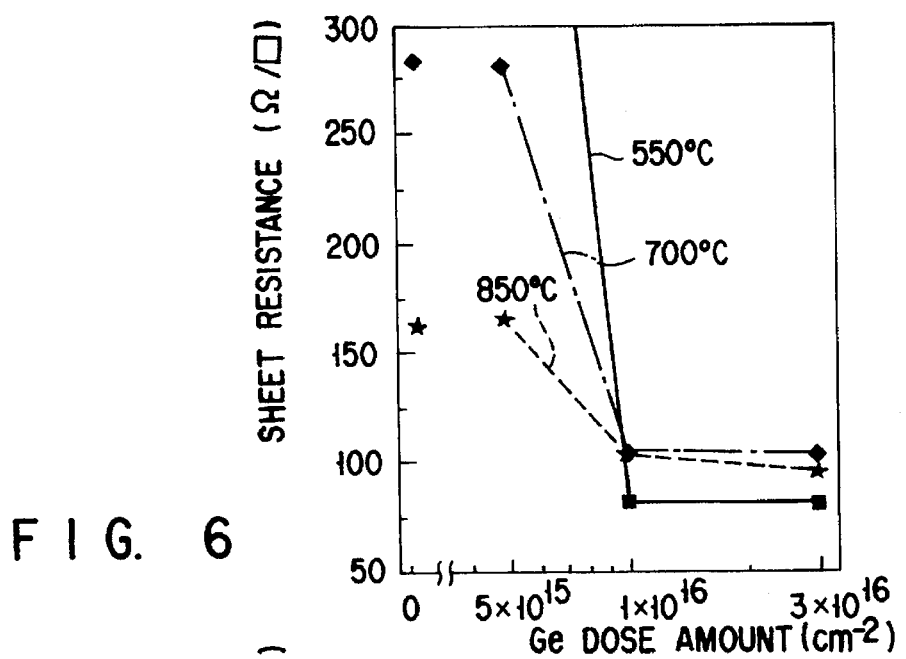
F I G. 6
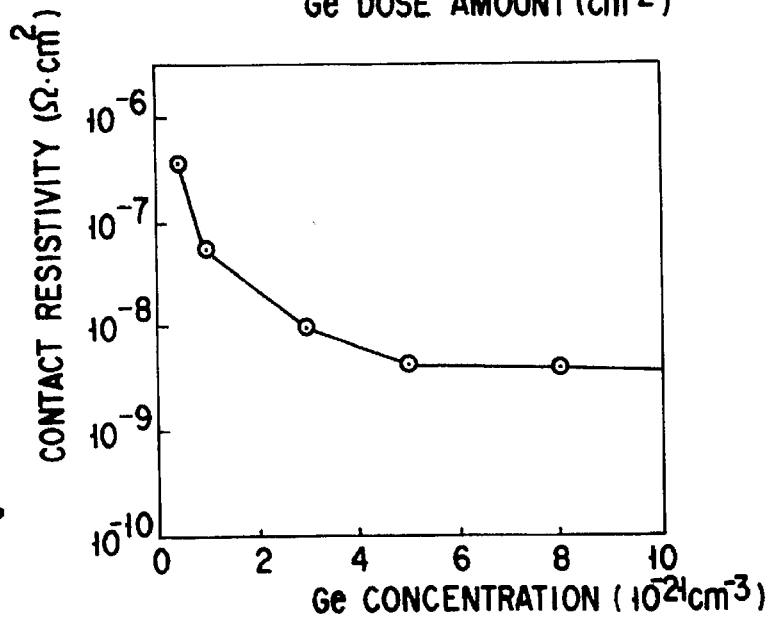
F I G. 7

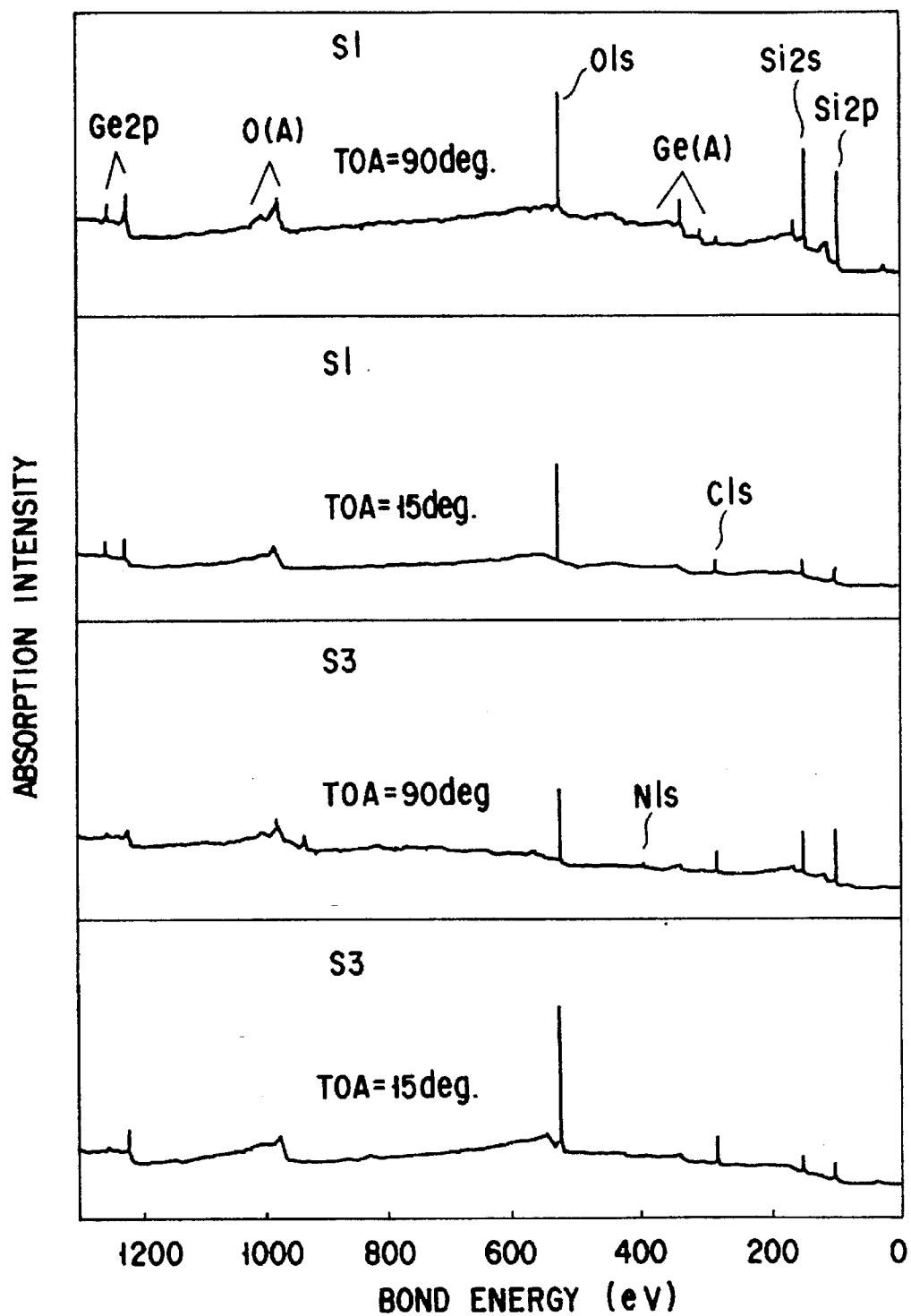
F I G. 11

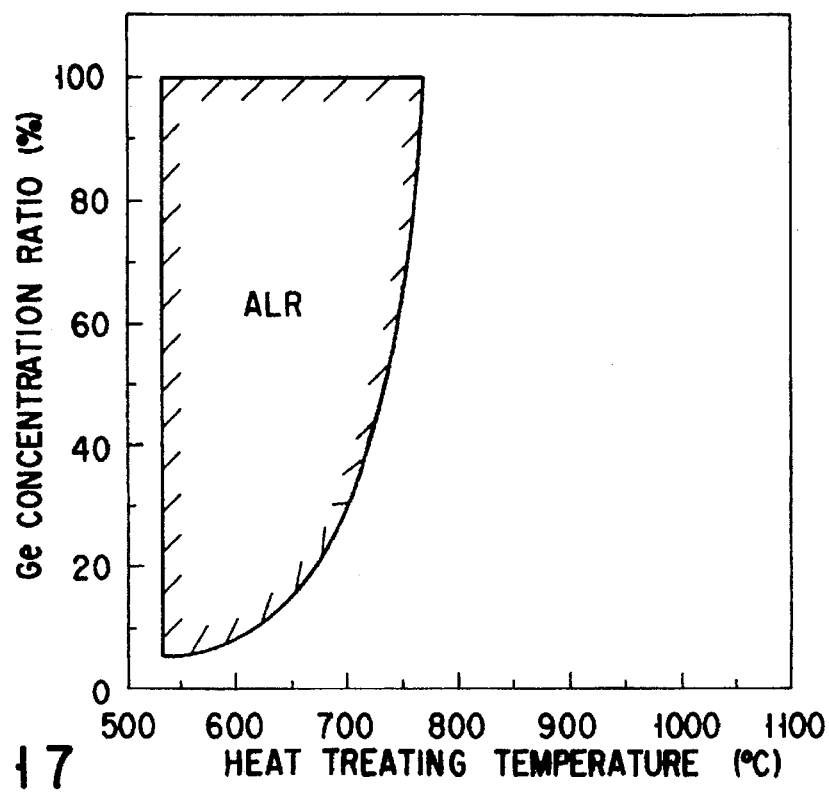
F I G. 17
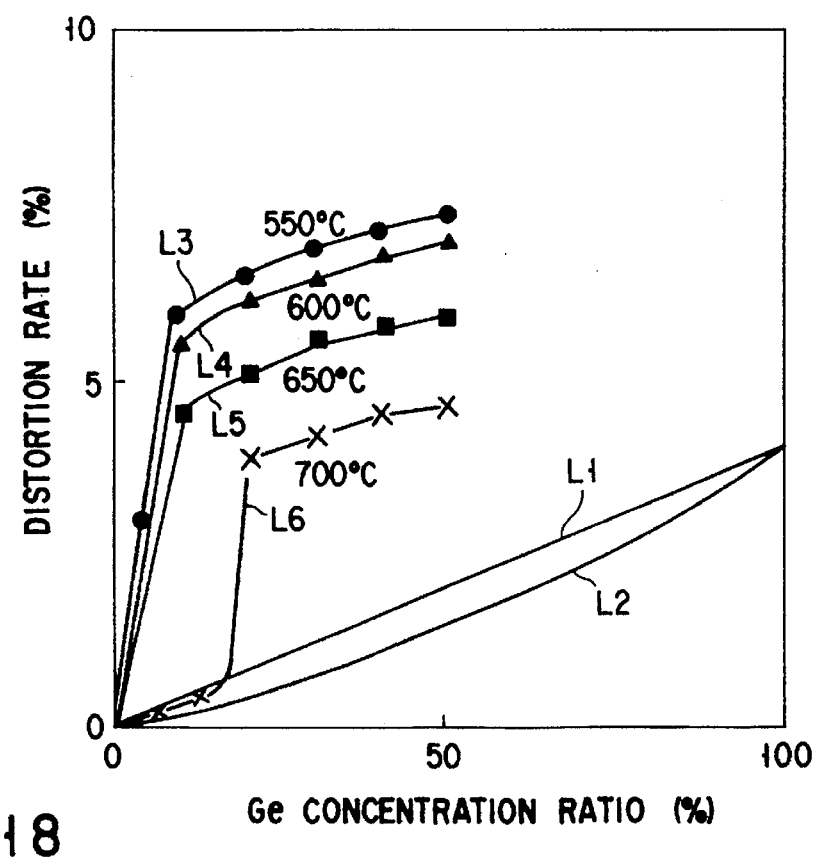
F I G. 18

SEMICONDUCTOR DEVICE

BACKGROUND OF THE INVENTION

1. Field of the Invention

The present invention relates to a semiconductor device comprising a contact formed between an electrode having a metallic conductivity and a silicon surface layer and a method of manufacturing the same, particularly, to the construction of a silicon surface layer containing an impurity in such a high concentration as to bring about a crystal distortion and a method of manufacturing the same, and to a method of forming a contact on a shallow diffusion layer.

2. Description of the Related Art

In accordance with miniaturization of semiconductor devices constituting an MOS integrated circuit, an increase in the contact resistance between a metal wiring and a semiconductor layer emerges as a big problem to be solved in addition to the layer resistance in the gate electrode and source/drain regions. In a transistor of 0.1 μm era, the gate length is as small as 0.1 μm, with the result that the on-resistance in the channel portion is only about 500Ω or less. On the other hand, when it comes to the contact resistance, each contact is allowed to have a contact resistance on the order of 1 kΩ to 10 kΩ in the case where a conventional value of contact resistance per unit area (or contact resistivity), falling in a range of $10^{-6}$ to $10^{-7} \Omega \cdot cm^2$, is used, because the contact size is as small as $10^{-10} cm^2$. As a result, the contact resistance, which must originally be a parasitic resistance, becomes higher than that of the channel resistance so as to be predominant and, thus, to control the operating speed of the semiconductor device. For avoiding detrimental effects on the performance of the apparatus, it is necessary to control the value of the contact resistance not to be larger than 20% of the channel resistance.

In general, the contact resistivity is determined by the Schottky barrier height between a metal member and a semiconductor layer and by the concentration of the electrically active impurity in the semiconductor layer, i.e., carrier concentration (electron or hole concentration). For decreasing the contact resistivity, the Schottky barrier height should desirably be lower. Also, it is easily anticipated from the field emission tunneling theory that the impurity concentration should desirably be higher for decreasing the contact resistivity. Let us consider a contact resistance between Al and Si layers. Where the contact resistivity or contact resistance per unit area is about $10^{-6}$ to $10^{-7}$ $cm^2$, the contact resistance can be decreased to about 1/10, which is substantially equivalent to reduction of the Schottky barrier height by 0.25 eV, by increasing the electrically active impurity concentration from $10^{20}$ $cm^{-3}$ to $2 \times 10^{20}$ $cm^{-3}$.

In order to decrease the Schottky barrier height by 0.25 eV, it is necessary to change the electrode material so as to change the work function. It should be noted in this connection that a decrease of the Schottky barrier height in respect of a p-type Si implies an increase of the Schottky barrier height in respect of an n-type Si. It follows that it is effective to increase the concentration of an electrically active impurity in a semiconductor layer in order to decrease the contact resistance. Several methods have been proposed to date along this line as briefly described below.

First of all, it is proposed to apply a heat treatment at high temperatures for a short time in order to increase the electrically active impurity concentration. In this method, impurity ions are implanted into a semiconductor substrate at a dose of about $10^{14}$ to $10^{15}$ $cm^{-2}$, followed by applying a heat treatment at high temperatures for a short time, i.e., 800° to 1050° C. for 20 to 60 seconds, under a nitrogen gas atmosphere so as to recover the crystallinity of the semiconductor substrate and, thus, to form an impurity layer having a high concentration of electrically activated impurity. In this method, however, it is impossible to increase the impurity concentration to a level exceeding the critical concentration of solid solution at a heat treating temperature. For example, it is impossible to achieve a boron (B) concentration of $2 \times 10^{20}$ $cm^{-3}$ or more in a Si layer. The contact resistivity between Al and Si layers in this case is at least about $10^{-7} \Omega \cdot cm^2$. It is considered impossible to further decrease the contact resistivity. It should also be noted that the impurity diffusion is brought about if the heat treatment is carried out at higher temperatures for a longer time, making it very difficult to form a shallow impurity diffusion layer. In short, it is impossible to form a shallow impurity diffusion layer while increasing sufficiently the impurity concentration, with the result that it is difficult to decrease sufficiently the contact resistance.

On the other hand, as disclosed in U.S. Pat. No. 5,413,943, it is possible to attain a carrier (hole) concentration corresponding to an activated boron atom concentration of at least $2 \times 10^{20}$ $cm^{-3}$, by implanting $10^{16}$ $cm^{-2}$ or more of boron ions into an Si substrate so as to form $B_{12}$. The method disclosed in this U.S. Patent certainly permits decreasing the contact resistivity to about $2 \times 10^{-8} \Omega \cdot cm^2$. However, it is very difficult to obtain a contact resistivity lower than $10^{-8}$ $cm^2$.

Other than the above described phenomena, a so-called pre-amorphous formation method is also known, in which a surface layer in an Si substrate is made into amorphous in advance of doping by introducing particles such as $Si^+$ or $Ge^+$, which are electrically neutral within Si and hardly affect the conductivity of Si, into the Si substrate by means of ion implantation at a dose of about $10^{14}$ to $10^{15}$ $cm^{-2}$. Then, a dopant element for achieving a desired conductivity type such as boron is introduced into the substrate by ion implantation at a dose of about $10^{14}$ to $10^{15}$ $cm^{-2}$. In this case, the amorphous layer formed in advance by the introduction of $Si^+$ or $Ge^+$ serves to prevent elements having a small mass such as boron from being channeled.

In the method outlined above, after a heat treatment, it is possible to obtain an activated impurity concentration higher than a critical concentration of solid solution at the temperature of the heat treatment. Even in this case, however, the lowest contact resistivity achieved between an Al layer and Si substrate is only about $10^{-7} \Omega \cdot cm^2$; it is impossible to further decrease the contact resistivity. It should also be noted that the concentration of the active impurity is lowered with elevation in the temperature in the heat treating step and with increase in the heat treating time. As a result, the concentration of the active impurity is lowered finally to the critical concentration of thermal equilibrium solid solubility and, thus, the contact resistance is increased.

Ge doping is proposed in, for example, Jap. Pat. Appln. KOKAI Publications No. 62-76550, No. 3-345630, No. 4-96325, No. 4-225568, and No. 5-90208. According to the Ge doping method disclosed in any of these prior arts, SiGe is formed by a heat treatment in an Si surface layer doped with Ge, making it possible to decrease the Schottky barrier height between a metal layer and a p-type semiconductor layer by about 0.1 to 0.2 eV. Further, a solid phase crystal growth from an amorphous state is achieved in this prior art, making it possible to achieve a high concentration of the active impurity. As a result, a decrease of the contact resistance is made possible.

Incidentally, Ge has an atomic radius greater than that of Si. Specifically, the lattice constant of Si is 0.543 nm;

whereas, the lattice constant of Ge is 0.566 nm. It follows that, where Si is doped with Ge at a high concentration, the Si crystal lattice is distorted so as to provide a major cause of crystal defect. To overcome the difficulty, B having an atomic radius smaller than that of Si is also doped so as to moderate the crystal distortion caused by the Ge doping in Si. In order to moderate the crystal distortion, a heat treatment is carried out in general at 800° C. or higher at which rearrangement of Si and Ge is likely to take place. However, the lowest contact resistivity achieved by this technique is only about $10^{-7} \Omega \cdot cm^2$, which results in a contact resistance of about 1 kΩ in a device of 0.1 μm era.

SUMMARY OF THE INVENTION

The present invention is intended to achieve a contact resistivity lower than $10^{-7} \Omega \cdot cm^2$ in respect of a diffusion layer having a junction depth of 0.1 μm or less in accordance with miniaturization of semiconductor devices, and provides a semiconductor device comprising an impurity diffusion layer having a high active impurity concentration and a shallow junction and a method of manufacturing the same.

In the present invention, the contact resistivity is lowered by various measures. First of all, an element, such as Ge, having an atomic radius larger than that of Si is introduced into a silicon substrate by means of ion implantation in an amount about 10 times as large as in the conventional pre-amorphous formation method. Also, B is introduced by ion implantation into Si at a concentration not lower than the critical concentration of solid solution. Further, a heat treatment is carried out at low temperatures. These measures are employed in combination in the present invention so as to achieve a high concentration of the activated impurity, and to introduce a crystal distortion into an Si surface layer. As a result, the distance between the Si crystal lattices is increased to form a crystal state in which the carrier can move easily within the Si crystal, thereby decreasing the contact resistivity.

As already pointed out, it is known to the art that the lattice constant of the diamond lattice of Ge is about 4% larger than that of Si. However, the present inventors have found that the lattice constant on the surface of a silicon substrate is enlarged by 6% or more in the case where Ge atoms in the amount of about 10% of the density of Si atoms are introduced by ion implantation into a surface region of the silicon substrate, followed by applying a heat treatment at a low temperature, e.g., about 550° C. Naturally, the enlargement of the lattice constant by 6% or more noted above is not simply caused by the difference in lattice constant between Ge and Si. It is considered reasonable to interpret the particular phenomenon to the effect that the distribution of a suitable amount of Ge atoms in the Si surface layer permits increasing the frequency of Ge—Ge bonds so as to replace the Si—Si bonds, with the result that the crystal distortion is rendered greater than the difference (4%) in lattice constant between Ge and Si. As a matter of fact, the covalent bond of Ge has a radius of 0.122 nm, which is about 10% larger than the radius 0.111 nm of the covalent bond of Si. This clearly supports the above-noted interpretation of the enlargement of the lattice constant by 6% or more.

Carrier (hole) mobility has also been measured. It has been found that the hole mobility is rendered at least 10 times as high as in a conventional Si—Ge structure having about the same Ge concentration. This clearly supports that the Si surface layer doped with a high concentration of Ge and having a crystal distortion as in the present invention quite differs in structure from the conventional Si—Ge structure.

Further, the Fermi level of the Si layer doped with Ge, which is caused by a heat treatment to contain activated B in a concentration higher than a limit of solid solution, can be read to be closer by at least 0.25 eV to a vacuum level (or work function smaller by at least 0.25 eV) than the uppermost energy level of the valence band of the Si substrate. The amount of this change has been found to at least twice the amount of change in the work function in the case of using Si—Ge having the same Ge concentration.

It is impossible to anticipate the features described above on the basis of extension of the semiconductor technology in the past.

According to a first aspect of the present invention, there is provided a semiconductor device, comprising:

a surface layer formed in a surface of a substrate layer made of silicon and containing carriers; and an electrode having a metallic conductivity arranged on the surface layer, a contact being formed between the surface layer and electrode, wherein, in order to decrease a Schottky barrier height at the contact, the surface layer contains a first impurity, serving to change a lattice constant, in a first concentration under a thermal non-equilibrium state, and the surface layer has a lattice constant larger than that of silicon containing the first impurity in the first concentration under a thermal equilibrium state.

According to a second aspect of the present invention, there is provided a semiconductor device, comprising:

a surface layer formed in a surface of a substrate layer made of silicon and containing carriers; and an electrode having a metallic conductivity arranged on the surface layer, a contact being formed between the surface layer and electrode, wherein, in order to decrease a Schottky barrier height at the contact, the surface layer contains a first impurity, serving to change a lattice constant, in a first concentration under a thermal non-equilibrium state, and occurrence of bonds between atoms of the first impurity in the surface layer is higher than that in silicon containing the first impurity in the first concentration under a thermal equilibrium state.

In the present invention, the first impurity contained in the surface layer permits making the lattice constant larger by at least 1%, preferably by at least 4%, than the lattice constant of silicon, with the result that the difference in work function between the metal and the semiconductor can be changed. Further, the first impurity causes the mobility of the carrier within the surface layer to be higher than that within the silicon substrate. For example, the mobility within the surface layer can be made at least two times, preferably at least ten times, as high as that in the silicon substrate, making it possible to decrease the contact resistance between the metal electrode and the surface layer containing the first impurity of the silicon substrate. As a result, the present invention makes it possible to form an impurity diffusion layer having such a high maximum carrier concentration as, for example, $2 \times 10^{20}$ cm$^{-3}$. Further, boron is used in the present invention as a second impurity serving to impart carriers to the surface layer. What should be noted is that the surface layer is allowed to contain Ge—B bonds and B—B bonds after the heat treatment following the boron ion implantation into the surface layer. It follows that it is possible to change the difference in work function between the metal electrode and the semiconductor layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 3 is a graph showing the carrier concentration profile relative to the temperature for the heat treatment after the ion implantation, covering the case where boron alone was introduced by ion implantation;

FIG. 4 is a graph showing the carrier concentration profile relative to the temperature for the heat treatment after the ion implantation, covering the case where both germanium and boron were introduced by ion implantation;

FIG. 5 schematically shows the evaluation of the crystallinity performed by an electron diffraction by FE-TEM;

FIG. 6 is a graph of sheet resistance relative to the dose in the step of germanium ion implantation;

FIG. 7 is a graph of contact resistivity relative to the germanium concentration;

FIG. 11 shows the result of qualitative analysis by XPS, covering an Example of the present invention and a Comparative Example;

FIG. 17 is a graph of germanium concentration relative to the temperature of a heat treatment in order to achieve a contact of an ultra-low resistivity, where the heat treatment is performed for 1 hour; and FIG. 18 is a graph of the lattice distortion rate of the silicon crystal relative to the germanium concentration.

DETAILED DESCRIPTION OF THE PREFERRED EMBODIMENTS

Let us describe some embodiments of the present invention with reference to the accompanying drawings.

FIGS. 1A to 1F collectively show how to manufacture a semiconductor device according to an embodiment of the present invention.

Figure 1A:
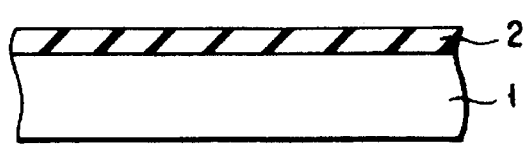
FIGS. 1A to 1F are cross sectional views collectively showing how to manufacture a semiconductor device according to an embodiment of the present invention.
Figure 1D:
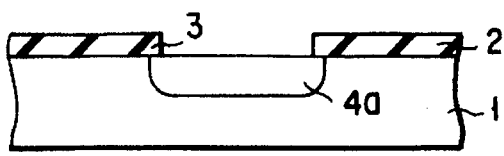
Figure 1B:
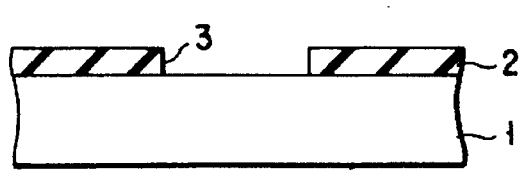
Figure 1E:
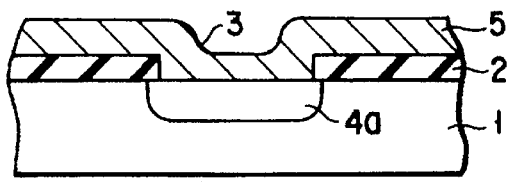
Figure 1C:
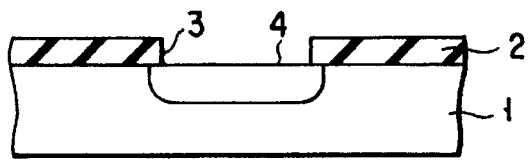
Figure 1F:
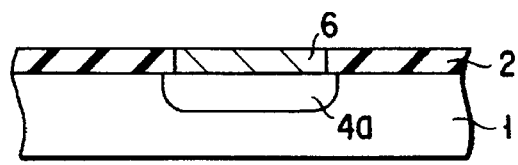

As shown in FIG. 1F, the semiconductor device of the present invention includes a surface layer or impurity diffusion layer 4a formed in a surface of a substrate layer or silicon substrate 1 and containing carriers, and an electrode 6 having a metallic conductivity and formed in direct contact with the surface layer 4a.

The surface layer 4a contains Ge serving as an impurity to change the lattice constant in a concentration of at least $1 \times 10^{21}$ cm$^{-3}$ under a thermal non-equibrium state. The lattice constant of the surface layer 4a is set larger than the lattice constant of a silicon layer containing the same concentration of Ge under a thermal equilibrium state. As a result, the Schittky barrier height formed at the contact between the surface layer 4a and the electrode 6 can be lowered. It should be noted that the occurrence of Ge—Ge bonds within the surface layer 4a is made higher than that within a silicon layer containing the same concentration of Ge under a thermal equilibrium state.

The surface layer 4a also contains an electrically active boron serving as an impurity to impart carriers to the surface layer 4a in a concentration higher than the critical concentration of solid solution under a thermal equilibrium state. Since Ge is contained together with B in the surface layer 4a, the carrier mobility within the surface layer 4a is made higher than that within silicon.

A method of manufacturing the semiconductor device according to the embodiment will be explained.

In the first step, a silicon dioxide film 2 having a thickness of 200 nm was formed by CVD (Chemical Vapor Deposition) on a surface of a single crystalline silicon substrate 1, as shown in FIG. 1A. Then, the silicon dioxide film 2 was patterned to form a contact hole 3 sized at 0.3 μm×0.3 μm, as shown in FIG. 1B. Incidentally, it is possible to have an n-type silicon layer formed in advance in the surface of the silicon substrate 1, the n-type silicon layer containing, for example, phosphorus in a concentration of $2 \times 10^{15}$ cm$^{-3}$. In this case, the n-type silicon layer is exposed to the outside by the patterning of the silicon dioxide film 2.

Then, Ge was introduced into a surface layer of the silicon substrate 1 by means of ion implantation under an accelerating energy of 50 keV and at a dose of $3 \times 10^{16}$ cm$^{-2}$, using the silicon dioxide film a as a mask. As a result, an amorphous ion implantation layer 4 was formed in the substrate 1, as shown in FIG. 1C. After introduction of Ge, B was also introduced into the ion implantation layer 4 by means of ion implantation under an accelerating energy of 10 keV and at a dose of $5 \times 10^{15}$ cm$^{-2}$. As already pointed out, Ge was used as an impurity serving to deform the silicon crystal so as to form a crystal having a lattice constant larger than that of the silicon crystal, while B was used as an impurity serving to impart carriers.

After the impurity introduction, a heat treatment was applied under a nitrogen gas atmosphere to the amorphous ion implantation layer 4 at 550° C. for one hour within a heating furnace. As a result, the ion implantation layer 4, which was amorphous, was brought back to a crystalline state. At the same time, Ge and B introduced into the layer 4 by means of ion implantation were diffused so as to form a p-type surface layer or an impurity diffusion layer 4a, as shown in FIG. 1D. A resistance heating furnace was used as the heating furnace.

Then, an Al layer (Al-1%Si) was deposited to a thickness of 400 nm on the silicon substrate so as to form a conductive layer 5 formed of a metallic film, as shown in FIG. 1E. The conductive film 5 can be formed by, for example, a sputtering technique.

Further, the conductive metallic film 5 was patterned to conform with the contact hole 3 so as to form an electrode 6, followed by applying a heat treatment at 450° C. for 15 minutes. As a result, an ohmic contact was achieved between the metallic electrode 6 and the surface layer 4a, as shown in FIG. 1F.

In the present invention, the conditions of the ion implantation and the heat treatment for forming the p-type surface layer or the impurity diffusion layer 4a, are determined to allow the surface layer 4a to contain Ge in a concentration of at least $1 \times 10^{21}$ cm$^{-3}$ and to contain B in a concentration higher than the critical concentration of solid solution, i.e., $2 \times 10^{20}$ cm$^{-3}$, under a thermal equilibrium state. What should be noted is that, after the heat treatment following the ion implantation step, the boron atoms are contained in the form of a solid solution within the surface layer 4a under the condition of a supersaturation.

What should also be noted is that the conditions of the ion implantation and the heat treatment for forming the surface layer 4a are determined to allow Ge and B to predominantly have the Ge—Ge bonds, Ge—B bonds and B—B bonds in the resultant surface layer 4a. It is also important to set the lattice constant within the surface layer 4a at a value which is at least 1% larger than that of silicon.

It should be noted that the carrier mobility within Ge is higher than that within Si. It follows that the presence of the Ge—B bonds and the enlargement of the lattice constant cause the carrier mobility within the surface layer 4a to be greater than that within an ordinary silicon layer.

In the present invention, the thermal budget of the surface layer 4a is controlled by using parameters, such as the temperature and time of the heat treatment following the ion implantation step, so as to allow Ge contained in the surface layer 4a to be under a thermal non-equilibrium state. Incidentally, the thermal budget should be controlled in view of all the heat treatments performed after the ion implantation step including the heat treatment which is carried out immediately after the ion implantation step.

The contact resistivity between the aluminum electrode 6 and the surface layer 4a was measured in respect of sample S1 obtained by the method described above, i.e., Example of the present invention, with the result that the contact resistivity was found to be $6.9 \times 10^{-9}$ Ω·cm$^2$.

In order to look into the effect of decreasing the contact resistivity in the sample 1, sample S2 constructed as shown in FIG. 1F was prepared as a Comparative Example. Sample S2 was substantially equal to sample S1, except that, in sample S2, boron alone was introduced by ion implantation under an acceleration energy of 10 keV and at a dose of $5 \times 10^{15}$ cm$^{-2}$ without introducing Ge into the surface layer 4a. Further, in sample S2 of the Comparative Example, a heat treatment was carried out immediately after the ion implantation step at 850° C. for 30 minutes under a nitrogen gas atmosphere. The contact resistivity for sample S2 (Comparative Example) was found to be $4 \times 10^{-7}$ Ω·cm$^2$.

As apparent from the experimental data, sample S1 according to an Example of the present invention was found to exhibit a contact resistivity markedly lower than that of sample S2 (Comparative Example). An additional experiment was conducted as in the Example of the present invention, except that the additional sample differed from sample S1 in the size of the contact hole. The resultant additional sample has been found to exhibit a markedly low contact resistivity like sample S1 of the present invention.

Figure 2:
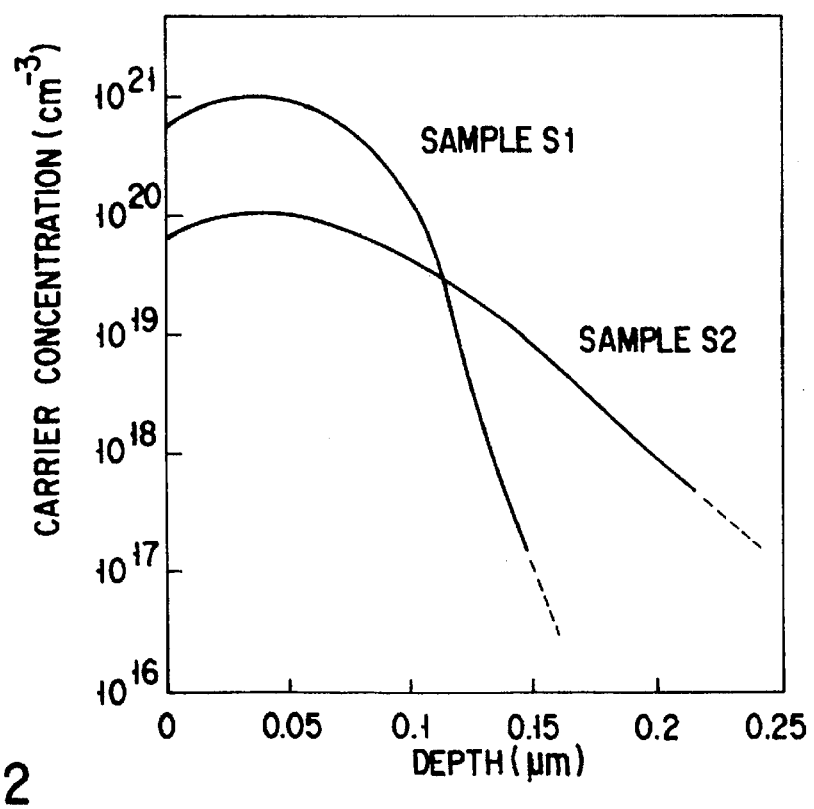
FIG. 2 is a graph showing the carrier concentration profile, i.e., the relationship between the carrier concentration and the depth, covering an Example of the present invention and Comparative Example.

Then, the carrier (or electrically active impurity) distribution near the contact region in a direction along the depth of the substrate was measured in respect of sample S1 (Example of the present invention) and sample S2 (Comparative Example). As shown in the graph of FIG. 2, the carrier concentration for sample S1 (Example of the present invention) has been found to be $2 \times 10^{20}$ cm$^{-3}$ in the contact region in the vicinity of the substrate surface, reaching the highest carrier concentration of $7 \times 10^{20}$ cm$^{-3}$. When it comes to sample S2 (Comparative Example), however, the carrier concentration in the vicinity of the contact region has been found to be only $1 \times 10^{20}$ cm$^{-3}$ or less. The experimental data clearly supports that, in sample S1 according to an Example of the present invention, an electrically active impurity is present in a concentration higher than the critical concentration of solid solution ($2 \times 10^{20}$ cm$^{-3}$) under a thermal equilibrium state within a silicon layer.

Further, in order to look into the effect produced by the heat treatment following the ion implantation step, the relationship between the carrier concentration distribution in the depth direction and the temperature for the heat treatment was examined, covering the cases where boron alone and both germanium and boron were introduced by means of ion implantation into a single crystalline silicon substrate. The ion implantation of boron was carried out under an acceleration energy of 10 keV and at a dose of $5 \times 10^{15}$ cm$^{-2}$. On the other hand, the ion implantation of germanium was carried out before the ion implantation of boron under an acceleration energy of 50 keV and at a dose of $3 \times 10^{16}$ cm$^{-2}$. After the ion implantation step, a heat treatment was applied at 550° C. to 850° C. for one hour under a nitrogen gas atmosphere. FIG. 3 shows the carrier concentration profile, covering the case where boron alone was introduced into the silicon substrate by ion implantation. On the other hand, FIG. 4 shows the carrier concentration profile, covering the case where both boron and germanium were introduced into the silicon substrate by ion implantation.

As shown in FIG. 3, the carrier concentration is increased and boron is diffused more inward within the substrate with increase in the temperature for the heat treatment in the case of implanting boron ions alone. In this case, the maximum carrier concentration, which was achieved in the case of the heat treatment at 850° C., was found to be about $2 \times 10^{20}$ cm$^{-3}$.

On the other hand, where both Ge and B ions are implanted into the substrate, boron is certainly diffused more inward the substrate with increase in the temperature for the heat treatment, as shown in FIG. 4. However, the boron diffusion into the substrate is suppressed, as compared with the implantation of B ions alone as in FIG. 3. It should be noted that, since Ge which forms a complete solid solution relative to Si is present in a high concentration, B is stabilized and is rendered less likely to be diffused. The maximum carrier concentration in this case is as high as about $7\times10^{20}$ cm$^{-3}$, which is substantially constant regardless of the temperature for the heat treatment. The experimental data clearly support that the Ge introduction in a high concentration by means of ion implantation permits forming a thermally stable high carrier concentration layer. However, since the carrier concentration in the contact region or near the substrate surface is only about $2\times10^{20}$ cm$^{-3}$, it is desirable to form the contact interface in a region having the highest carrier concentration in order to decrease the contact resistivity as desired. To be more specific, it is desirable to remove the surface layer (low carrier concentration region) of the substrate by, for example, etching before formation of the metal electrode.

In the experiments described above, the maximum carrier concentration in the contact region was $2\times10^{20}$ cm$^{-3}$, as already pointed out. On the other hand, the sample S1 according to the Example of the present invention, which was referred to previously, was found to exhibit such a low contact resistivity as $6.9\times10^{-9}\Omega\cdot$cm$^2$. It is impossible to obtain such a low contact resistivity by simply increasing the carrier concentration. Specifically, the Schottky barrier height between Al and Si, i.e., difference in work function, is about 0.45 eV in the case of a p-type diffusion layer. In this case, the calculated value of the contact resistivity is $1\times10^{-7}\Omega\cdot$cm$^2$ even when the carrier concentration is $2\times10^{20}$ cm$^{-3}$. Further, even if SiGe is assumed to have been formed, it is impossible to explain the very low contact resistivity described above, though the difference in work function is certainly lowered by about 0.1 eV.

It is considered reasonable to understand that, where Ge is introduced in a high concentration by means of ion implantation, a crystal deformation takes place to bring about a marked change in the work function. Therefore, an electron diffraction pattern was obtained by FE-TEM (Field Emission Transmission Electron Microscope), the electron diffraction pattern showing a fine crystal region in the vicinity of the contact interface of the impurity diffused surface layer of the monocrystalline silicon substrate. For obtaining the sample used in this experiment, Ge was introduced by ion implantation under an acceleration energy of 50 keV and at a dose of $3\times10^{16}$ cm$^{-2}$. Also, B was introduced by ion implantation under an acceleration energy of 10 keV and at a dose of $5\times10^{15}$ cm$^{-2}$. Further, a heat treatment immediately after the ion implantation was carried out at 550° C. for one hour.

FIG. 5 schematically shows the diffraction pattern obtained by the experiment described above. The white circles shown in FIG. 5 denote the diffraction patterns in a region of about 40 nm from the surface of the substrate, i.e., the diffraction patterns in the vicinity of the contact interface. On the other hand, the black dots in FIG. 5 denote the diffraction patterns in a deeper region of the silicon substrate where the silicon crystal is not affected by ion implantation of Ge and B. It is clearly seen from FIG. 5 that the diffraction patterns in the vicinity of the contact interface, which are denoted by the white circles, are positioned inward of the diffraction patterns in the deeper region of the substrate, which are denoted by black dots. This implies that the lattice constant is enlarged in the vicinity of the contact interface. The calculated value of the enlargement of the lattice constant in this case is at least 5% including the camera length.

It should be noted in this connection that the lattice constant for silicon is 0.543 nm in contrast to 0.565 nm for germanium. Therefore, the difference in lattice constant between silicon and germanium is 0.022 nm. It follows that, even if a complete germanium crystal is formed as a result of the Ge ion implantation, the increase in lattice constant is at most only 4%. In other words, it is impossible to explain the above-noted enlargement by 5% of the lattice constant on the basis of the Si—Ge bond formation.

Diffraction patterns were similarly obtained in the case of introducing boron alone by means of ion implantation. In this case, however, no change was observed in the diffraction pattern derived from a change in the lattice constant.

The results of the experiments referred to above suggest that the very low contact resistivity obtained by the Ge ion implantation in a high concentration is derived not only from the increased carrier concentration but also from the crystal deformation effective for changing the work function, which takes place in the vicinity of the contact interface.

It should be noted that the difference between the on-resistance of the channel and the contact resistance is diminished with decrease in the element size. Approximately, where the element size is diminished to 1/k, the contact resistance is made k$^2$ times as high as that before the change of the element size, though the on-resistance of the channel remains unchanged. It follows that the reduction in the contact resistivity by the method described above is made more effective with increase in the degree of miniaturization of the semiconductor device.

Then, the present inventors looked into the relationship between the dose of Ge by ion implantation and the sheet resistance of the impurity diffusion layer. The Ge introduction was carried out by an ion implantation under an acceleration energy of 50 keV and at a dose of $5\times10^{15}$ cm$^{-2}$ to $3\times10^{16}$ cm$^{-2}$. After the Ge introduction by an ion implantation, boron was introduced by an ion implantation under an acceleration energy of 10 keV and at a dose of $5\times10^{15}$ cm$^{-2}$. After the ion implantation for Ge and B, a heat treatment was applied at 550° C. to 850° C. for one hour under a nitrogen gas atmosphere. The sheet resistance of the impurity diffusion layer thus formed within a single crystalline silicon substrate was measured, with the results as shown in FIG. 6.

FIG. 6 clearly shows that the sheet resistance is decreased with increase in the dose of Ge. To be more specific, it is seen that, where the dose of Ge is $5\times10^{15}$ cm$^{-2}$ or Ge ions are not implanted at all, the sheet resistance is dependent on the temperature for the heat treatment, that is, the sheet resistance is lowered with increase in the temperature for the heat treatment. On the other hand, if the dose of Ge is set at $1\times10^{16}$ cm$^{-2}$ or higher, such a low sheet resistance as 100Ω/□ can be obtained even if the heat treatment is applied at such a low temperature as 550° C. Further, the temperature dependence of the sheet resistance ceases to be observed under the dose of Ge set at $1\times10^{16}$ cm$^{-2}$ or higher.

The results of the experiments shown in FIG. 6 reflect the presence of Ge in a high concentration, not an effect of the pre-amorphous formation referred to herein previously in conjunction with the prior art. In the pre-amorphous formation, an amorphous state is sufficient even with a dose of $1\times10^{15}$ cm$^{-2}$. In the present invention, however, a very low sheet resistance can be obtained by setting the Ge dose at $1\times10^{16}$ cm$^{-2}$ or more and the Ge concentration at $1\times10^{21}$ cm$^{-3}$ or more.

Then, the relationship between contact resistance per unit area (or contact resistivity) and the germanium concentration was examined. In this experiment, the ion implantation for the Ge introduction was carried out under an acceleration energy of 50 keV using as a variable the Ge concentration within the impurity diffusion layer after the ion implantation. After the Ge ion implantation, boron was introduced by means of ion implantation under an acceleration energy of 10 keV and at a dose of $5 \times 10^{15}$ cm$^{-2}$, followed by applying a heat treatment at 550° C. for one hour under an nitrogen gas atmosphere. Samples were prepared by the process steps shown in FIGS. 1A to 1F under the conditions described above so as to measure the contact resistivities. FIG. 7 shows the results. As apparent from the experimental data shown in FIG. 7, the contact resistivity was found to be decreased with increase in the germanium concentration.

Figure 8:
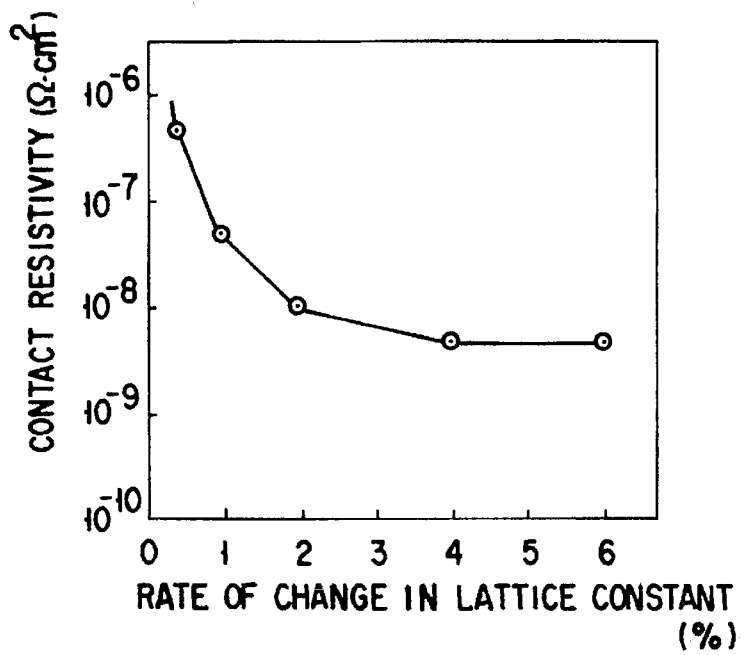
FIG. 8 is a graph of contact resistivity relative to the rate of change in the lattice constant.

Further, examined was the relationship between the contact resistivity and the rate of change in the lattice constant in the vicinity of the contact interface. The change of rate in the lattice constant was defined to be: R(%)=(A−B)/B, where R(%) is the rate of change in the lattice constant, A is the lattice constant of the surface layer, and B is the bulk lattice constant of the Si substrate. FIG. 8 shows the results. As seen from the experimental data shown in FIG. 8, the contact resistivity is lowered with increase in the rate of change in the lattice constant. The experimental data given in FIG. 8 clearly support that the very low contact resistivity obtained by the Ge ion implantation in a high concentration is derived from not only the markedly increased carrier concentration but also from the crystal deformation taking place in the vicinity of the contact interface.

A sample according to a Comparative Example was prepared. In this case, Si ions were implanted in a high concentration into a single crystalline silicon substrate so as to make a surface region of the substrate amorphous, followed by implanting boron ions under the conditions described above so as to obtain a sample of the Comparative Example. In this Comparative Example, a layer of a high carrier concentration was certainly obtained in the case where the heat treatment after the ion implantation was carried out at a low temperature, i.e., 550° C. However, the peak concentration of the carrier was found to decrease with increase in the temperature for the heat treatment. Further, in the evaluation utilizing the electron diffraction pattern by FE-TEM, no change derived from a change in the lattice constant was recognized in the diffraction pattern. These clearly support that the presence of Ge in a high concentration is absolutely necessary for achieving a high activation and a very low contact resistivity.

As described previously, the sample S1 according to the Example of the present invention, which was prepared by the process steps shown in FIGS. 1A to 1F, exhibited a contact resistivity of $6.9 \times 10^{-9} \Omega \cdot$cm$^2$ between the aluminum electrode and the impurity diffusion layer.

In order to look into the effect of decreasing the contact resistivity in the Example of the present invention, a sample S3 constructed as shown in FIG. 1F was prepared as a Comparative Example under the conditions equal to those employed for the preparation of sample S1, except that the heat treatment after the ion implantation was carried out in preparing sample S3 at 850° C. for 30 minutes under a nitrogen gas atmosphere. Resultant sample S3 of the Comparative Example was found to exhibit a contact resistivity of $8 \times 10^{-8} \Omega \cdot$cm$^2$.

As apparent from the comparative test described above, sample S1 according to an Example of the present invention permits a marked decrease in the contact resistivity, compared with sample S3 of the Comparative Example. Additional samples were prepared by the method of the present invention by changing the size of the contact hole, with the result that the contact resistivity was also decreased similarly, as in sample S1.

Figure 9:
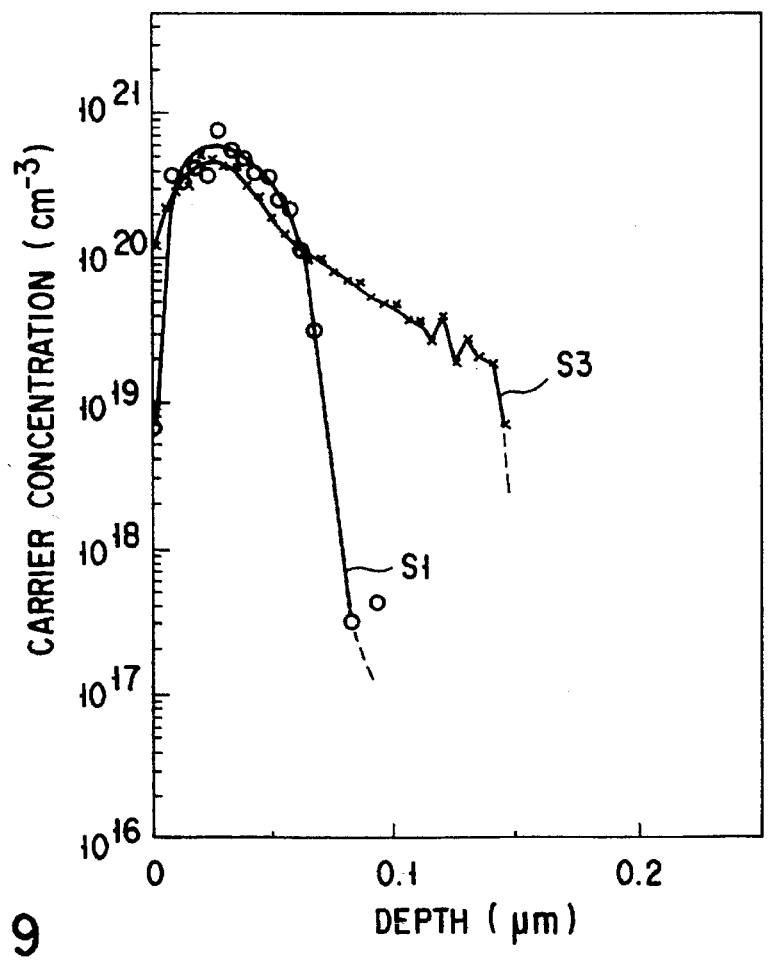
FIG. 9 is a graph of carrier concentration relative to the depth, covering an Example of the present invention and a Comparative Example.

Further, the carrier concentration profile in the depth direction of the substrate was examined by measuring the concentration of holes, i.e., electrically active impurity, in the contact region in respect of each of sample S1 according to an Example of the present invention and sample S3 of the Comparative Example, with the results as shown in FIG. 9.

It is seen from FIG. 9 that samples S1 and S3 clearly differ from each other in the impurity diffusion behavior in the depth direction of the substrate. However, each of these samples S1 and S3 exhibited a maximum carrier concentration of $7 \times 10^{20}$ cm$^{-3}$ and a carrier concentration in the substrate surface layer, i.e., in the vicinity of the contact interface, of $2 \times 10^{20}$ cm$^{-3}$. In other words, the experimental data clearly support that an electrically active impurity is present in the Si substrate in a high concentration exceeding the critical concentration of solid solution under a thermal equilibrium state.

The experimental data shown in FIG. 9 also support that the contact resistivity is determined by not only the carrier concentration but also other factors. It should be noted that, in the experiments described above, the carrier concentration in the vicinity of the contact interface was found to be $2 \times 10^{20}$ cm$^{-3}$ in each of sample S1 (Example of the present invention) and sample S3 for the Comparative Example. However, such a low contact resistivity as $6.9 \times 10^{-9} \Omega \cdot$cm$^2$ was obtained in sample S1 alone, which differed from sample S3 in simply the conditions of the heat treatment after the ion implantation step. This clearly supports that it is unreasonable to explain the contact resistivity in terms of only the carrier concentration.

It may be reasonable to understand that a change in crystal state which is large enough to lower the difference in work function takes place in the process of conversion from an amorphous state into a single crystalline state, the conversion accompanying the heat treatment after the ion implantation step. In this connection, FIG. 10 shows the relationship between the mobility and concentration of the carrier, which was determined on the basis of the hole measurement referred to in conjunction with FIG. 9.

Figure 10:
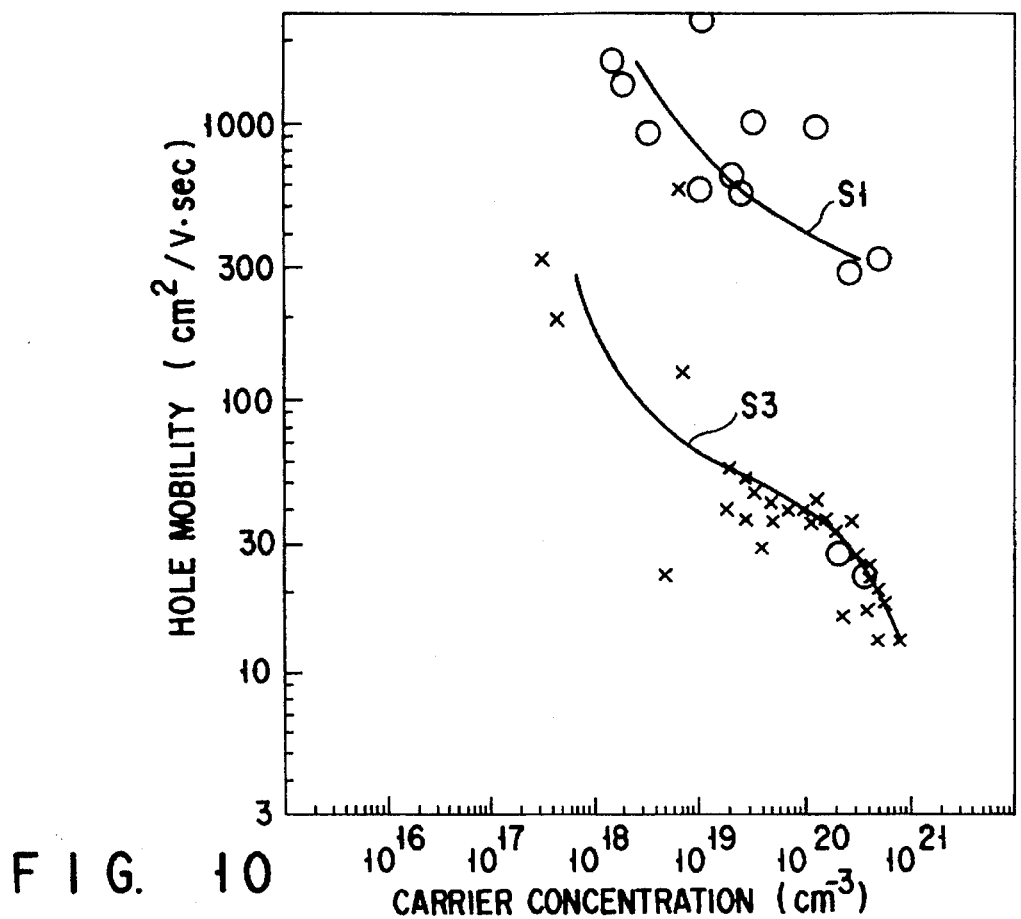
FIG. 10 is a graph of carrier (hole) mobility relative to the carrier concentration, covering an Example of the present invention and a Comparative Example.

As shown in FIG. 10, the carrier mobility tends to be decreased with increase in the carrier concentration in each of sample S1 (Example of the present invention) and sample S3 (Comparative Example). However, the carrier mobility for sample S1 is about 10 times as high as that for sample S3, when the comparison is made on the basis of the same carrier concentration. Since the carrier mobility determined from the Irvin Curve is about 35 cm$^2$/V·sec when the carrier concentration is $5 \times 10^{20}$ cm$^{-3}$, sample S1 according to an Example of the present invention clearly indicates that the crystallinity within the recrystallized layer is made different, though no change is recognized in sample S3 of the Comparative Example.

In general, it is known to the art that the hole mobility within a silicon layer is 480 cm$^2$/V·sec, whereas the hole mobility within a germanium layer is 1900 cm$^2$/V·sec. In short, the hole mobility within a germanium layer is about 4 times as high as that within a silicon layer. However, the hole mobility for sample S1 was found to be about 10 times as high as that for sample S3, as already pointed out. The difference in the hole mobility between samples S1 and S3 is markedly larger than that between silicon and germanium. It is considered reasonable to understand that a change in the crystal state, e.g., crystal distortion, takes place in sample S1 in a manner to increase the carrier mobility.

In order to look into the bonding state of impurities within a recrystallized layer, a qualitative analysis was carried out by XPS (X-ray Photoelectron Spectroscopy), with the results as shown in FIG. 11.

As seen from FIG. 11, a peak in the absorption spectrum of Ge in sample S1 according to an Example of the present invention is markedly higher than that in sample S3 for the Comparative Example. The incident angle of X-ray is set at 15° and 90° in FIG. 11. It is shown that the former is incident in the vicinity of the substrate surface, with the latter being incident inside the substrate. To be more specific, the increase in the intensity of the Ge absorption spectrum represents an influence given inward of the substrate. It is clearly indicated that, in sample S1 according to an Example of the present invention, the bonding state is changed within the recrystallized layer.

Figure 12:
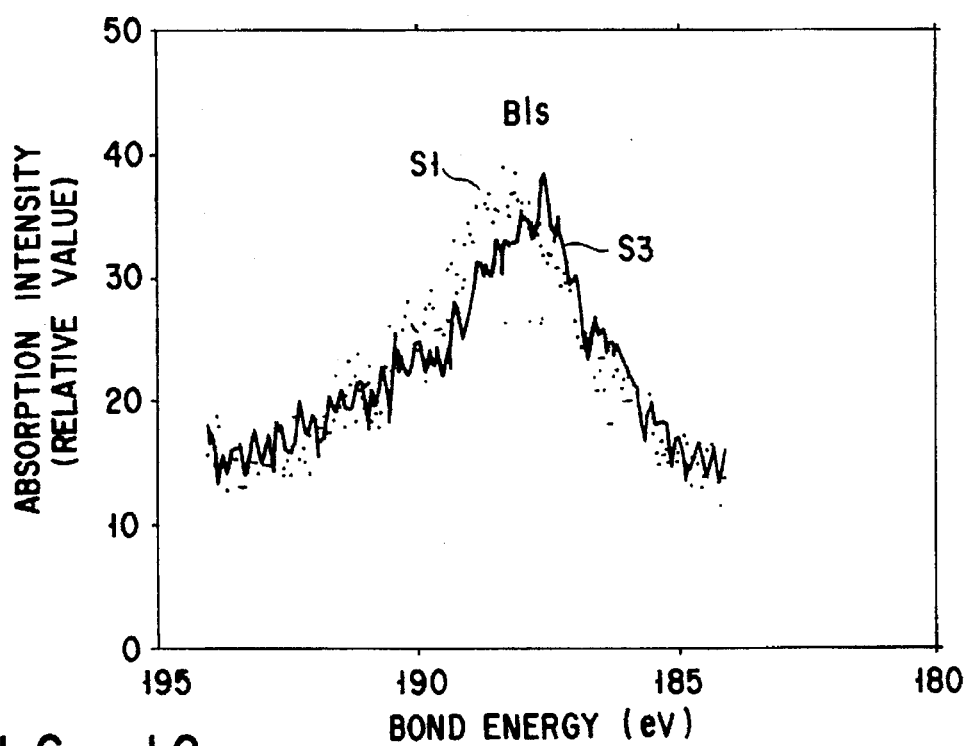
FIG. 12 shows the absorption peaks determined by XPS in the vicinity of B1s orbit, covering an Example of the present invention and a Comparative Example.

Further, a qualitative analysis by means of XPS was similarly carried out, with attentions paid to the conditions in the vicinity of the Bls orbit. FIG. 12 shows the results. The dotted line in FIG. 12 denotes sample S1 (Example of the present invention), with the solid line denoting sample S3 (Comparative Example). The spectra in the vicinity of the Bls orbit, which are shown in FIG. 12, clearly show that the bond energies are changed for both samples. To be more specific, in sample S3 for the Comparative Example, which is denoted by the solid line, changes in the absorption spectrum are observed at 186.8 eV and 187.5 eV, which are on the low energy side. These are identified as absorption peaks caused by the presence of B bonded to silicon at 3-coordinating position and 4-coordinating position, respectively. On the other hand, when it comes to sample S1 (Example of the present invention), which is denoted by the dotted line, a change in the absorption spectrum is recognized on the higher energy side. This indicates the presence of bonding with an element other than silicon. In view of the elements which may be present in this case, it is of no difficulty to anticipate the formation of B—B bond and Ge—B bond.

The experimental data described above suggest that it is impossible to explain the very low contact resistivity, which can be obtained by the Ge ion implantation in a high concentration, by simply the increase in the carrier concentration. In order to form a contact region having a very low contact resistivity, it is necessary to introduce a crystal lattice distortion so as to form a crystal state which permits the mobility of the carrier to be higher than that of silicon. It is impossible to explain the particular phenomenon by the formation of a highly active layer based on the pre-amorphous formation method, or the reduction in the work function or the reduction of the contact resistivity based on the SiGe formation. It is considered reasonable to understand that the above-noted effect produced in the present invention is obtained by the in-take of boron into the condition that germanium is precipitated in the vicinity of the substrate surface.

In the embodiment described above, the impurity diffusion layer 4a is formed in a surface layer of the silicon substrate 1. However, it is of course possible to apply the technical idea of the present invention to the case where a single crystalline silicon layer, a polycrystalline silicon layer, or an amorphous silicon layer is added first onto a substrate, followed by forming an impurity diffusion layer in a surface layer of the silicon layer formed on the substrate. In the present invention, the substrate and the additional layer are referred to as a substrate layer.

Further, a shallow surface layer having a very low sheet resistance can be obtained in the present invention, making it possible to employ the technique of the present invention for forming not only a contact region in a semiconductor device but also a shallow impurity diffusion layer.

In the embodiment shown in FIGS. 1A to 1F, an electrode was formed on the initial surface of the substrate. However, in the case of forming a contact region having a very low resistivity, it is desirable to form a contact interface in a region having the highest carrier concentration. FIGS. 13A to 13F collectively show a method of manufacturing a semiconductor device according to another embodiment of the present invention, in which a contact interface is formed in a region having the highest carrier concentration.

Figure 13A:
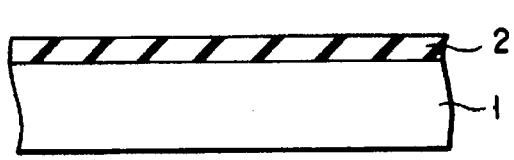
FIGS. 13A to 13F are cross sectional views showing how to manufacture a semiconductor device according to another embodiment of the present invention.

In the first step, a silicon dioxide film 2 having a thickness of 200 nm was formed by CVD (Chemical Vapor Deposition) on a surface of a single crystalline silicon substrate 1, as shown in FIG. 13A. Then, the silicon dioxide film 2 was patterned to form a contact hole 3 sized at 0.3 µm×0.3 µm, as shown in FIG. 13B. Incidentally, it is possible to have an n-type silicon layer formed in advance in the surface of the silicon substrate 1, the n-type silicon layer containing, for example, phosphorus in a concentration of $2\times10^{15}$ cm$^{-3}$. In this case, the n-type silicon layer is exposed to the outside by the patterning of the silicon dioxide film 2.

Then, Ge was introduced into a surface layer of the silicon substrate 1 by means of ion implantation under an acceleration energy of 50 keV and at a dose of $3\times10^{16}$ cm$^{-2}$, using the silicon dioxide film a as a mask. As a result, an amorphous ion implantation layer 4 was formed in the substrate 1, as shown in FIG. 13C. After introduction of Ge, B was also introduced into the ion implantation layer 4 by means of ion implantation under an acceleration energy of 10 keV and at a dose of $5\times10^{15}$ cm$^{-2}$. As already pointed out, Ge was used as an impurity serving to deform the silicon crystal so as to form a crystal having a lattice constant larger than that of the silicon crystal, while B was used as an impurity serving to impart carriers.

After the impurity introduction, a heat treatment was applied under a nitrogen gas atmosphere to the amorphous ion implantation layer 4 at 550° C. for one hour within a heating furnace. As a result, the ion implantation layer 4, which was amorphous, was brought back to a crystalline state. At the same time, Ge and B introduced into the layer 4 by means of ion implantation were diffused so as to form a p-type surface layer or an impurity diffusion layer 4a. A resistance heating furnace was used as the heating furnace.

Figure 13D:
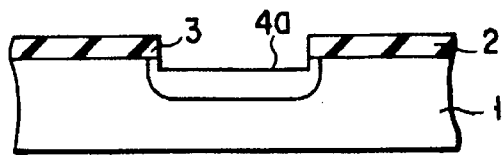
Figure 13B:
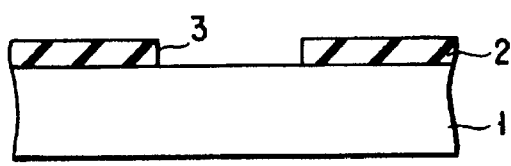

After the heat treating step, the surface layer of the semiconductor substrate was etched by a down flow etching so as to remove the surface layer in a thickness of about 40 nm, as shown in FIG. 13(D). The etching in this step was intended to allow the peak in the carrier concentration in the impurity diffusion layer 4a to be flush with the interface between an electrode 6 and the impurity diffusion layer 4a.

Figure 13E:
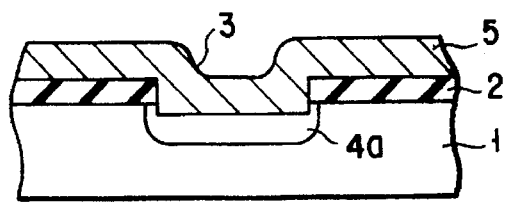
Figure 13C:
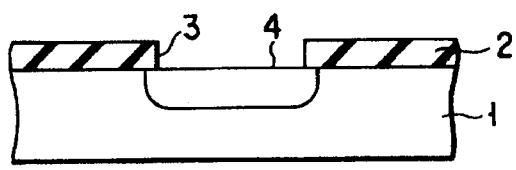

Then, an Al layer (Al-1%Si) was deposited to a thickness of 400 nm on the silicon substrate so as to form a conductive layer 5 formed of a metallic film, as shown in FIG. 13E. The conductive film 5 can be formed by, for example, a sputtering technique.

Figure 13F:
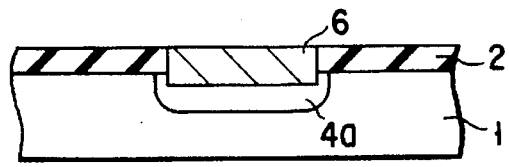

Further, the conductive metallic film 5 was patterned to conform with the contact hole 3 so as to form the electrode 6, followed by applying a heat treatment at 450° C. for 15 minutes. As a result, an ohmic contact was achieved between the metallic electrode 6 and the surface layer 4a, as shown in FIG. 13F.

The contact resistivity between the aluminum electrode and the impurity diffusion layer was found to be $4\times10^{-9}$ Ω·cm$^2$ to $6\times10^{-9}$ Ω·cm$^2$.

In the method shown in FIGS. 13A to 13F, the etching of the substrate 1 or the impurity diffusion layer 4a is performed after the heat treatment following the ion implantation step, with the remaining silicon dioxide film used as an etching mask. As described above, the particular etching is carried out to allow the peak in the carrier concentration in the impurity diffusion layer 4a to be flush with the interface between the electrode 6 and the impurity diffusion layer 4a. However, the etching for this purpose can be carried out before the heat treatment following the ion implantation step or before formation of the silicon dioxide film. Further, the dry etching employed in the method shown in FIGS. 13A to 13F can be replaced by other etching methods such as a wet etching.

In each of the embodiments shown in FIGS. 1A to 1F and FIGS. 13A to 13F, germanium was used as an impurity serving to change the carrier mobility and the lattice constant of the silicon layer. However, carbon or tin can also be used as such an impurity in place of germanium, with substantially the same effect.

In each of the embodiments shown in FIGS. 1A to 1F and FIGS. 13A to 13F, boron was used as an impurity serving to impart carriers to the surface layer. However, other impurities which can be made electrically active within the silicon substrate such as arsenic, phosphorus, gallium, indium and antimony can also be used as such an impurity in place of boron, with substantially the same effect.

Further, in each of the embodiments shown FIGS. 1A to 1F and FIGS. 13A to 13F, aluminum was used for forming the electrode 6 which is in contact with the impurity diffusion layer. However, other materials having a metallic conductivity such as elemental metals like copper, tungsten, and titanium and compounds like silicides of transition metals such as cobalt silicide, nickel silicide, palladium silicide, platinum silicide, and titanium silicide, can also be used in place of aluminum, with substantially the same effect. Particularly, where a silicide of the transition metal is used for forming the electrode or the lower part of the electrode, the silicide can be formed by the reaction with the silicon substrate. In this case, the etching in the surface layer of the impurity diffusion layer 4a shown in FIG. 13 D can be omitted by allowing the interface between the resultant silicide layer and the silicon substrate to be flush with the peak in the carrier concentration in the impurity diffusion layer 4a.

For achieving a very low contact resistivity between the electrode 6 and the impurity diffusion layer 4a, it is important to form appropriately the impurity diffusion layer 4a, such that a crystal lattice distortion is imparted to the impurity diffusion layer 4a so as to cause the carrier mobility within the impurity diffusion layer 4a to be higher than that in the silicon substrate, as well as increasing the active impurity concentration in the impurity diffusion layer 4a. In each of the embodiments described with reference to FIGS. 1A to 1F and FIGS. 13A to 13F, the heat treatment for forming the impurity diffusion layer was carried out at low temperatures, because the germanium concentration was about 10% in each of these embodiments. Where the germanium concentration is sufficiently high, however, the model described above can be obtained even if the heat treatment for forming the impurity diffusion layer is carried out at high temperatures.

FIGS. 14 to 17 are graphs each showing the relationship between the Ge concentration and the temperature for the heat treatment required for providing a very low contact resistivity between the electrode 6 and the impurity diffusion layer 4a. The graphs shown in FIGS. 14 to 17 cover the cases where the heating time for the heat treatment was set at 30 seconds, 60 seconds, 120 seconds, and 1 hour, respectively. In each of these graphs, the Ge concentration ratio (%) plotted on the ordinate is defined as: Ge concentration/(Ge+Si) concentration×100 (%). Also, the region ALR shaded in each of these graphs represents the conditions which permit achieving a very low contact resistivity, $10^{-8} \Omega \cdot cm^2$ or less.

Figure 14:
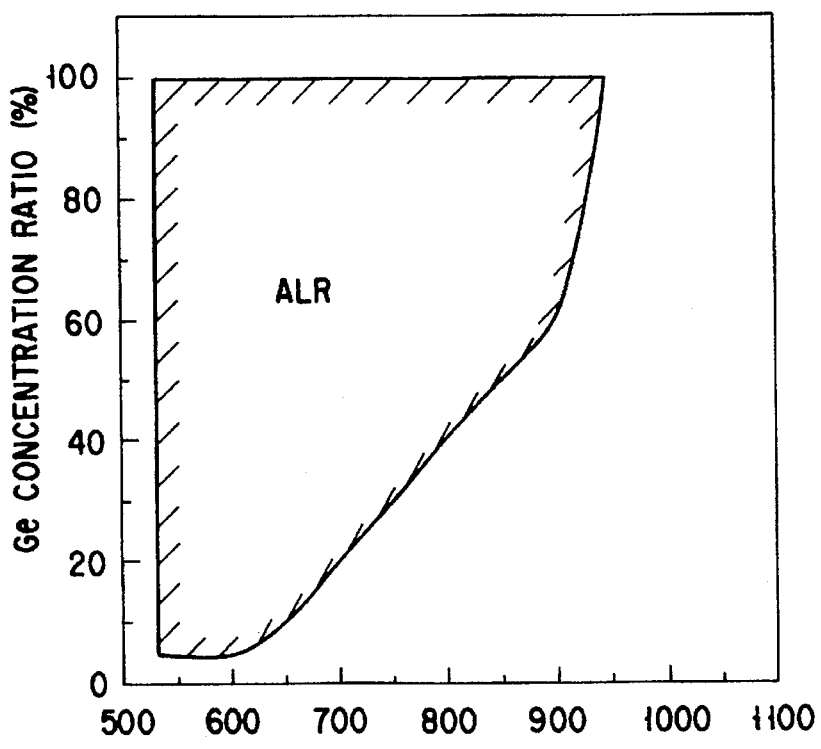
FIG. 14 is a graph of germanium concentration relative to the temperature of a heat treatment in order to achieve a contact of an ultra-low resistivity, where the heat treatment is performed for 30 seconds.

FIG. 14 shows that, where the heat treatment is performed for 30 seconds, the range of heat treatment which permits achieving a very low contact resistivity in question can be enlarged with increase in the Ge concentration. This indicates that, with increase in the Ge concentration, the active impurity concentration is increased and, at the same time, the crystal state having a lattice distortion which permits increasing the carrier mobility is stabilized. In other words, with increase in the Ge concentration, the state that the Ge—Ge bonds and Ge—B bonds are predominant is thermally held stable.

Figure 15:
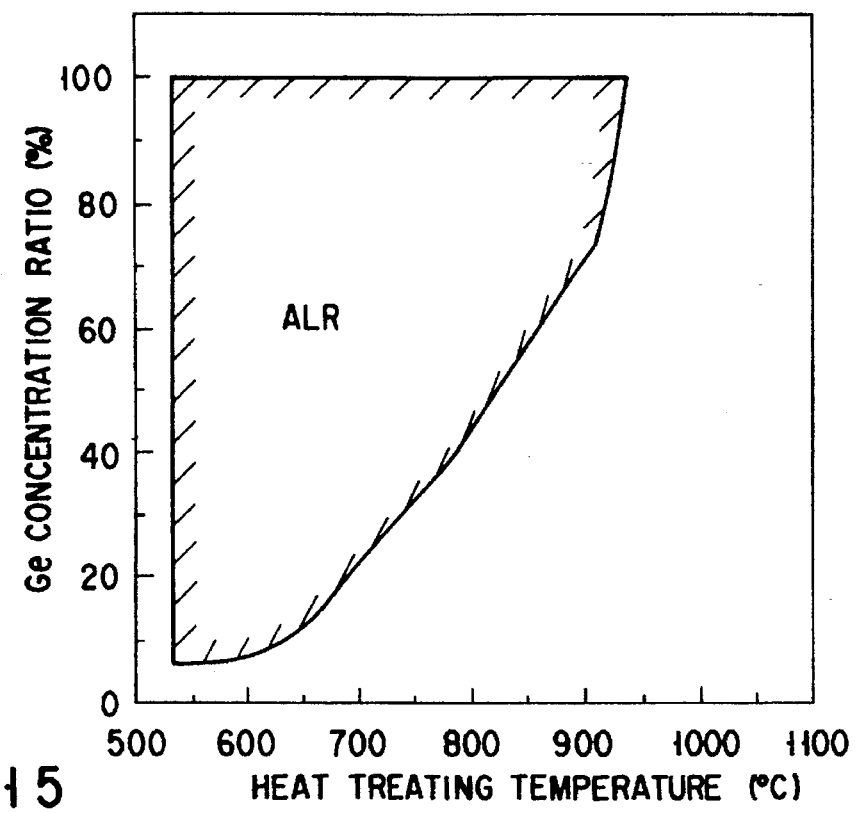
FIG. 15 is a graph of germanium concentration relative the temperature of a heat treatment in to order to achieve a contact of an ultra-low resistivity, where the heat treatment is performed for 60 seconds.
Figure 16:
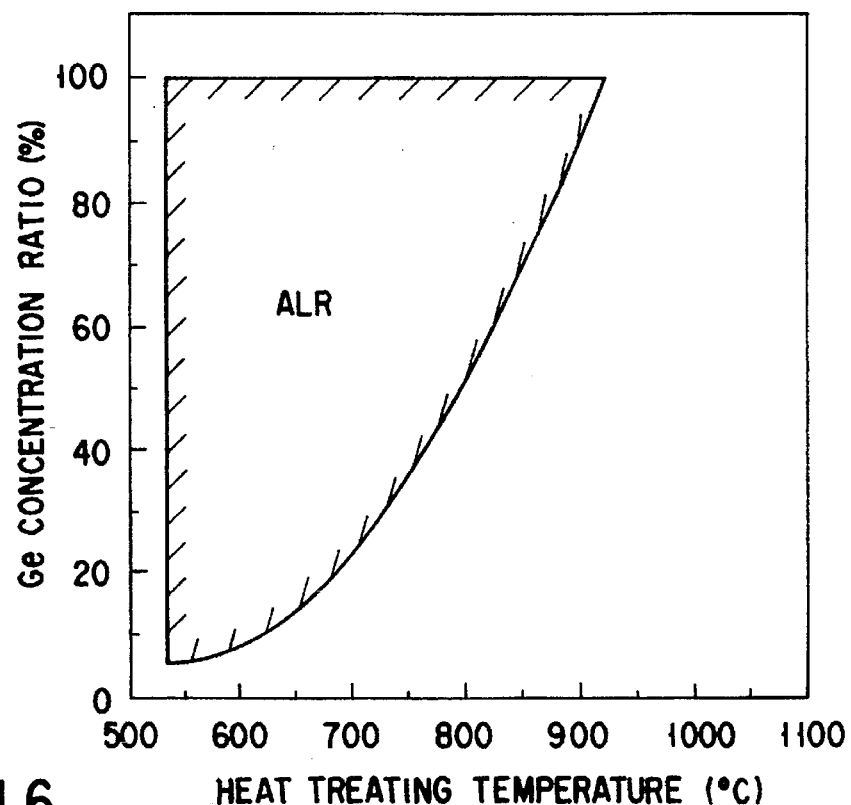
FIG. 16 is a graph of germanium concentration relative to the temperature of a heat treatment in order to achieve a contact of an ultra-low resistivity, where the heat treatment is performed for 120 seconds.

On the other hand, FIGS. 15, 16 and 17 which cover the cases where the heat treatment is performed for 60 seconds, for 120 seconds, and for one hour, respectively, collectively indicate that, with increase in the heat treating time, the conditions which permits achieving a very low contact resistivity in question of $10^{-8} \Omega \cdot cm^2$ or less, i.e., ALR regions, are shifted from the higher temperature side to the lower temperature side. It should be noted in this connection that the lattice is more severely vibrated with increase in temperature, with the result that the lattice tends to be brought back to a thermal equilibrium state with increase in the temperature for the heat treatment. In other words, the lattice distortion tends to be moderated to decrease the distortion rate with increase in the temperature for the heat treatment. It follows that, where the heating temperature is 700° C. or less at which the thermal lattice vibration is small, a thermal non-equilibrium state can be maintained even if the time for the heat treatment is increased. In other words, where the heating temperature is 700° C. or lower, the Ge—Ge bonds and Ge—B bonds are retained at a high occurrence rate, with the result that a very low contact resistivity can be obtained, if the germanium concentration is low.

The lattice distortion achieved in the present invention by the Ge doping is so large as not to be anticipated by the conventional examples or conventional theory. In this connection, FIG. 18 shows the relationship between the lattice distortion rate of a silicon crystal and the germanium concentration ratio. The term "lattice distortion rate" noted above is defined as: $DR=(C1-C0)/C0 \times 100$ (%), where DR denotes the lattice constant rate (%), C1 denotes the lattice constant of Ge-doped Si, and C0 denotes the lattice constant of Si. Line L1 shown in FIG. 18 denotes the result of calculation covering the case where the distortion rate is assumed to be proportional to the Ge concentration. Line L2 denotes the distortion rate obtained in the ordinary Si—Ge crystal which is obtained after the heat treatment or film formation at temperatures of 800° C. or higher. Further, lines L3 to L6 cover the distortion rates for the cases where the heat treatments were carried out at 550° C., 600° C., 650° C. and 700° C., respectively, for one hour.

As apparent from FIG. 18, the distortion rates denoted by lines L3 to L6 are markedly higher than those denoted by lines L1 and L2. The conventional Si—Ge crystal is under a thermal equilibrium state, with the result that the distortion is moderated so as to reach a minimum value. Where the Ge concentration is low under a thermal equilibrium state, Si is bonded with a high probability with Ge, with the result that Si—Ge bonds are formed with a high probability. Under the state of bonds obtained in the present invention, however, the Ge—Ge bonds are formed at a probability higher than that of Si—Ge bonds.

What should be noted is that a non-thermal equilibrium state in which Ge contained in a Si crystal exhibits a good stability is generated only under the condition of thermal budget defined by the limited temperature range and the limited time range in respect of the heat treatment performed after the ion implantation step. In the present invention, the thermal budget of the surface layer 4a is controlled, with the temperature and time of the heat treatment used as parameters so as to obtain a stable thermal non-equilibrium state of germanium contained in the surface layer 4a. Incidentally, for evaluating the thermal budget, it is important to take into consideration all the heat treatments performed after the ion implantation step including the heat treatment performed immediately after the ion implantation step. Further, it is desirable to set the highest temperature for the heat treatment at 700° C., where the time of the heat treatment is about 1 hour or less. The highest temperature, however, can be higher with reference to the Ge concentration, where the time of the heat treatment is 2 minutes or less. Further, it is desirable to set the heating rate at 100° C./sec or more, and the cooling rate at 50° C./sec or more.

As described above in detail, the present invention makes it possible to allow a shallow surface layer of a silicon substrate to contain an active impurity at a high concentration, and to introduce a crystal distortion into the impurity diffused surface layer so as to increase the carrier mobility within the shallow surface layer having a high impurity concentration. It follows that it is possible to markedly decrease the contact resistivity between the impurity diffused surface layer and the metal electrode formed in direct contact with the surface layer.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device, comprising:

a surface layer formed in a surface of a silicon underlayer; and an electrode having a metallic conductivity arranged on said surface layer such that a contact is formed between said surface layer and said electrode, said surface layer containing a first impurity in a first concentration which causes the value of a lattice constant in the surface layer to be larger than in the silicon underlayer, and a second impurity in a second concentration for serving to impart carriers in the surface layer, both said first and second impurities serving to decrease a contact resistance of said contact, wherein, atomic bonds are formed in the surface layer by atoms of the first and second impurities which are predominantly between atoms of said first impurity, between atoms of said first and second impurities, and between atoms of said second impurity.

2. The device according to claim 1, wherein electrically active atoms of said second impurity have a concentration higher than a critical concentration of a solid solution in silicon under a thermal equilibrium state.

3. The device according to claim 1, wherein said first impurity is an element selected from a group consisting of carbon, germanium and tin, and said second impurity is an element selected from a group consisting of boron, arsenic, gallium, indium and antimony.

4. The device according to claim 3, wherein said surface layer contains germanium as said first impurity in a concentration of at least $1 \times 10^{21}$ cm$^{-3}$, and boron as said second impurity which includes electrically active boron atoms in a concentration of at least $2 \times 10^{20}$ cm$^{-3}$.

5. The device according to claim 4, wherein said surface layer has a lattice constant larger than that of silicon by at least 5%.

6. The device according to claim 1, wherein said first impurity causes carrier mobility within said surface layer to be higher than that within silicon.

7. The device according to claim 1, wherein said first impurity is an element selected from a group consisting of carbon, germanium and tin.

8. The device according to claim 7, wherein said surface layer contains, as said first impurity, germanium in a concentration of at least $1 \times 10^{21}$ cm$^{-3}$.

9. The device according to claim 1, wherein said surface layer contains, as said second impurity, an electrically active element selected from a group consisting of boron, phosphorus arsenic, gallium, indium and antimony.

10. The device according to claim 9, wherein said surface layer contains, as said second impurity, boron which includes electrically active atoms in a concentration of at least $2 \times 10^{20}$ cm$^{-3}$.

11. The device according to claim 1, wherein said surface layer contains germanium and boron as said first and second impurities, respectively, such that the germanium and boron are contained in the surface layer under a state of solid solution including Ge—B bonds.

12. The device according to claim 11, wherein said surface layer has a thickness of 100 nm or less.

13. The device according to claim 1, wherein said contact between said surface layer and said electrode is formed at a position corresponding to a peak of concentration of said carriers provided by said second impurity.

* * * * *